United States Patent

[19]

Takei

[11] 3,975,647

[45] Aug. 17, 1976

[54] BOOTSTRAP CIRCUIT

[75] Inventor: Akira Takei, Sagamihara, Japan

[73] Assignee: Keishin Matsumoto, Director-General, Agency of Industrial Science and Technology, Tokyo, Japan

[22] Filed: Feb. 7, 1975

[21] Appl. No.: 547,938

[30] Foreign Application Priority Data

June 6, 1974 Japan.............................. 49-63441

[52] U.S. Cl............................... 307/228; 307/293; 307/246; 328/176; 307/261
[51] Int. Cl.² ....................................... H03K 17/00
[58] Field of Search.................. 328/176, 181, 184; 307/293, 229, 228, 214, 246, 261

[56] References Cited
UNITED STATES PATENTS 3,899,692 8/1975 Caswell.............................. 328/176

FOREIGN PATENTS OR APPLICATIONS 707,688 4/1954 United Kingdom................. 328/176
682,864 11/1952 United Kingdom................. 328/176

OTHER PUBLICATIONS

IBM Tech. Disclre. Bulletin, High–Voltage Switch Utilizing Boot Strapping, A. Stritt, vol. 12 No. 7 12/69, p. 1059.

Primary Examiner—Stanley D. Miller, Jr.
Assistant Examiner—B. P. Davis
Attorney, Agent, or Firm—Staas & Halsey

[57] ABSTRACT

A bootstrap circuit is disclosed which has capacitors, each connected between the base of a collector grounded transistor and the ground and between the emitter and the base of the same transistor and converts a rectangular input signal train into a sawtooth wave signal train. The bootstrap circuit is further provided with a switching circuit connected in series with the capacitor connected between the emitter and the base of the transistor and the switching circuit is opened when the supply of the rectangular input signal is stopped.

4 Claims, 3 Drawing Figures

BOOTSTRAP CIRCUIT

BACKGROUND OF THE INVENTION

1. Field of the Invention

This invention relates to a bootstrap circuit which is supplied with a rectangular wave to produce a sawtooth wave, and more particularly to a bootstrap circuit having a feedback capacitor.

2. Description of the Prior Art

A bootstrap circuit is one that is supplied with a rectangular wave to produce a sawtooth wave of excellent linearity as an output signal, and is employed for converting an amplitude modulated waveform into a pulse phase modulated waveform or a pulse width modulated waveform, for example.

A typical bootstrap circuit is one that is provided with a feedback capacitor. However, in the typical bootstrap circuit, when an input burst signal has a long period of time between bursts or when the signals are of low frequency in the burst, the output signal characteristic is deteriorated due to discharge of the feedback capacitor, so that the circuit cannot be used in practice.

SUMMARY OF THE INVENTION

This invention is to provide a bootstrap circuit which is free from the aforesaid defect of the prior art and is adapted such that its output signal characteristic is not deteriorated even when it is supplied with an input burst signal that has a long period of time between bursts or a signal of low frequency.

Briefly stated, the bootstrap circuit of this invention comprises first and second capacitors, respectively connected between the base of a collector grounded transistor and the ground and between the emitter and the base thereof, and is employed for converting an input rectangular signal train into a sawtooth wave signal train, and is characterized in that a switching circuit is connected in series with the capacitor provided between the emitter and the base of the transistor and is opened when the supply of the rectangular signal is stopped.

Other objects, features and advantages of this invention will become apparent from the following description taken in conjunction with the accompanying drawings.

DESCRIPTION OF THE PREFERRED EMBODIMENTS

To facilitate a better understanding of this invention, a description will be given first of one example of conventional bootstrap circuits.

Figure 1:
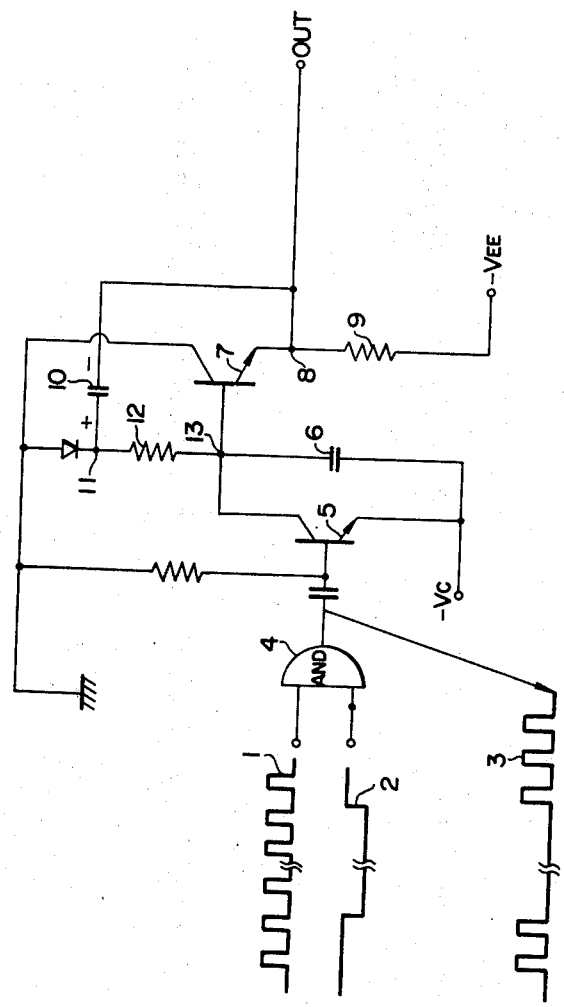
FIG. 1 shows one example of conventional bootstrap circuits.

FIG. 1 shows a schematic of a conventional bootstrap circuit. The operation of the illustrated example will be described on the assumption that a burst signal is applied as an input signal.

A pulse waveform signal 1 and a gating signal 2 are applied to an AND circuit 4 to derive therefrom a burst signal train 3. The signal train 3 is applied to a switching transistor 5, which is turned on and off depending upon whether the rectangular input signal applied thereto is of high or low level. When the switching transistor 5 is in its on state, a current flows to a point $-Vc$ through a point 13 and the switching transistor 5, so that capacitor 6 is not charged. A feedback capacitor 10 is previously charged. When the switching transistor 5 is turned off, the capacitor 6 starts to be charged and the potential at the point 13 correspondingly rises. The potential rise at the point 13 is applied to the base of a transistor 7, of emitter follower construction, to derive at its emitter on output with a voltage gain of 1 and, since the feedback capacitor 10 is previously charged, this potential rise leads to a potential rise at a point 11.

Accordingly the potential difference between the points 11 and 13 across a resistor 12 is always constant. A constant current flows in the resistor 12 and a current flowing in the capacitor 6 becomes constant, so that the output from the emitter of the transistor 7 rises linearly and the output signal becomes a sawtooth wave signal.

Figure 2:
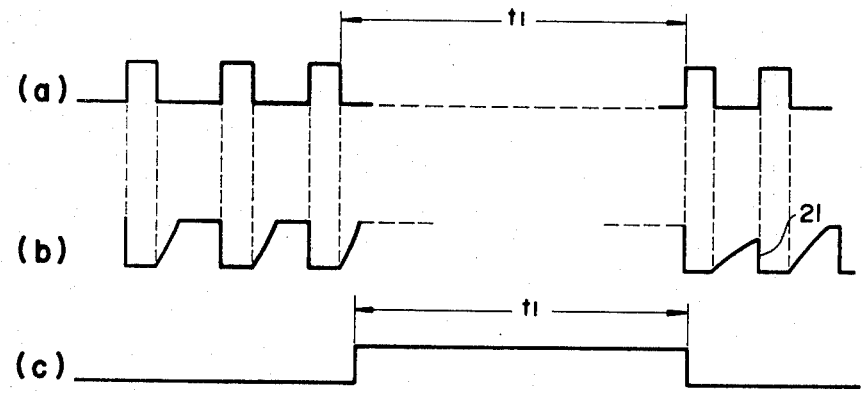
FIG. 2 is a time chart, for explaining this invention.

A time chart of the above operation is shown in FIG. 2. In FIG. 2, $a$ shows the input signal 3 in FIG. 1, which is applied to the switching transistor 5, and $b$ shows the output signal derived from the emitter of the transistor 7.

The conventional circuit described above has the following defect. For example, when the time interval $t_1$ between the burst signal train in FIG. 2 increases (about several milliseconds), the feedback capacitor 10 is discharged due to the formation of a closed loop by the feedback capacitor 10, the resistor 12 and the base and the emitter of the transistor 7.

Consequently, when the next burst signal train starts, feedback by the feedback capacitor 10 is not sufficiently achieved as indicated by 21, with the result that the linearity of the output waveform is deteriorated.

Figure 3:
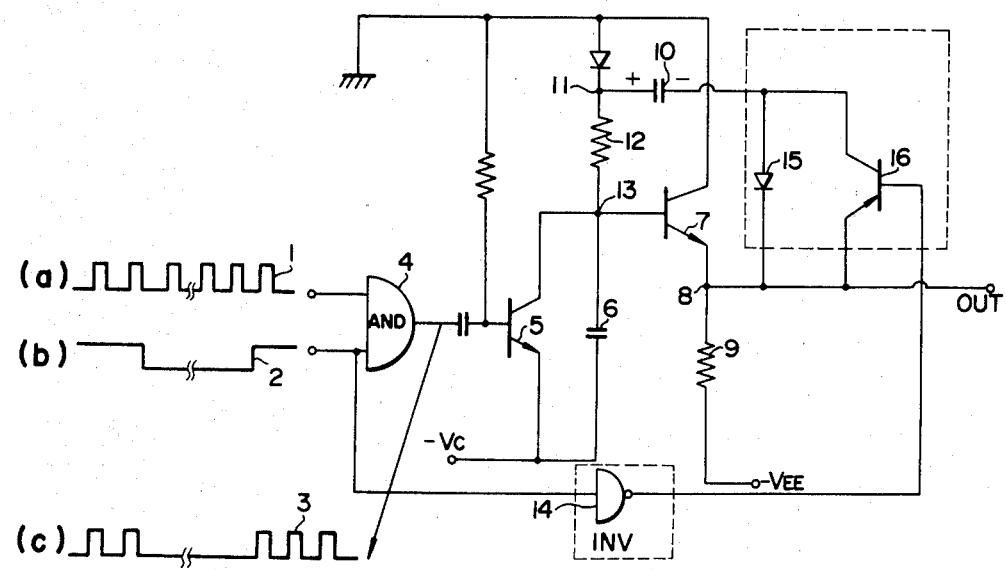
FIG 3. illustrates one example of this invention.

This invention is intended to overcome such a defect of the prior art. FIG. 3 illustrates one example of this invention. The broken line blocks indicate circuits added according to this invention. In FIG. 3, parts corresponding to those in FIG. 1 are marked with the same reference numerals. The elements added according to this invention are a diode 15, a transistor 16 and an inverter 14. The circuit operation of the illustrated example will be described below. However, the operation, from the time the switching transistor 5 is turned off until the potential rise at the point 13, is the same as that shown in FIG. 1 and, hence, will not be repeated.

In the circuit shown in FIG. 3, the output signal from the inverter 14, which is supplied with the input signal 2 and shown in FIG. 2c, is applied to the base of the transistor 16. The transistor 16 is turned on or off depending upon whether the output signal from inverter 14 is of a low or high level, respectively. Accordingly, during the period of the burst signal, the output from the inverter 14 is of a low level and the transistor 16 is in its on state, so that a sawtooth wave signal is derived from the emitter of the transistor 7 in exactly the same manner as in the circuit of FIG. 1. Then, during the time interval $t_1$ between successive burst signal train, the signal output from the inverter 14 is of a high level, as depicted in FIG. 2c, with the result that the transistor 16 is turned off. Further, since the diode 15 is inserted in a backward direction relative to the feedback capacitor 10, the loop for discharge of the feedback capacitor 10 is effectively opened. Consequently, discharge of the feedback capacitor 10 is prevented during the time internal $t_1$ between successive burst signal train. Moreover, the reason why the diode 15 is inserted is to pass a charging current for the feedback capacitor 10. Namely, charging of the feedback capacitor 10 is achieved via a route from the ground to a point-VEE through the point 11, the feedback capacitor 10, the diode 15 and the resistor 9.

With the addition of the circuit as described above, discharge of the feedback capacitor 10 is prevented, so that feedback from the emitter of the transistor to the base thereof is always effected without fail, making it possible to obtain a normal sawtooth wave at all times even in the case when input burst signal trains are separated by long intervals as in the present example.

Although this invention has been described in connection with a burst-like signal train, the invention is also applicable to a low-frequency input signal of long pulse interval, by the same operation as in the foregoing.

It will be apparent that many modifications and variations may be effected without departing from the scope of the novel concepts of this invention.

What is claimed is:

1. A bootstrap circuit for converting a series of rectangular input signal trains, successive said trains being separated by a predetermined time interval, into a corresponding series of separated sawtooth wave signal trains, comprising:
   a voltage source;
   an emitter follower transistor having an emitter, a collector, a base, and being responsive to each rectangular input signal of said signal trains being received at said base thereof;
   a first capacitor electrically connected between the base of said emitter follower transistor and said voltage source;
   a second capacitor electrically connected in a feedback loop between said base and said emitter of said emitter follower transistor;
   wherein the improvement comprises a switching circuit connected in series with said second capacitor in said feedback loop for opening said feedback loop during said time interval between successive said rectangular input signal trains.

2. A bootstrap circuit as in claim 1, wherein said switching circuit comprises a switching transistor and a diode, said diode is electrically connected between the collector and the emitter of said switching transistor and provides a charging path for said second capacitor during each rectangular input signal of said signal trains.

3. A bootstrap circuit as in claim 2, wherein said switching transistor turns on when said rectangular input signal trains are received by said emitter follower transistor providing a feedback loop between said emitter and said base of said emitter follower transistor and turns off during the time interval between said rectangular input signal trains, whereby said switching circuit prevents said second capacitor from discharging, during said time interval, through said feedback loop.

4. A bootstrap circuit as in claim 3, wherein said improvement, further comprises an inverter circuit for controlling the operation of said switching circuit.

* * * * *